United States Patent [19]

Hsu et al.

[11] Patent Number: 5,021,399
[45] Date of Patent: Jun. 4, 1991

[54] SPRAY PYROLYSIS PROCESS FOR PREPARING SUPERCONDUCTIVE FILMS

[75] Inventors: Hsyh-Min Hsu; Ian Y. K. Yee, both of Austin, Tex.

[73] Assignee: Microelectronics & Computer Technology Corp., Austin, Tex.

[21] Appl. No.: 322,454

[22] Filed: Mar. 10, 1989

[51] Int. Cl.$^5$ .......................... B05D 5/12; B05D 3/02
[52] U.S. Cl. ........................................ 505/1; 505/737; 505/742; 427/62; 427/226; 427/314; 427/372.2; 427/375; 427/376.1; 427/376.2
[58] Field of Search .................. 505/1, 729, 733, 737, 505/739, 742; 427/62, 226, 314, 372.2, 375, 376.1, 376.2

[56] References Cited

U.S. PATENT DOCUMENTS

| | | | |
|---|---|---|---|
| 2,763,569 | 9/1956 | Bradstreet et al. | 427/226 |
| 3,607,385 | 9/1981 | Namikata et al. | 427/226 |
| 4,327,119 | 4/1982 | Lis et al. | 427/74 |
| 4,331,707 | 5/1982 | Muruska et al. | 427/74 |
| 4,336,285 | 6/1982 | Squillante | 427/314 |
| 4,338,362 | 7/1982 | Turcotte | 427/314 |
| 4,427,714 | 1/1984 | Davey | 427/87 |
| 4,505,949 | 3/1985 | Jelks | 427/38 |
| 4,523,051 | 6/1985 | Mickelsen et al. | 136/258 |
| 4,571,350 | 2/1986 | Parker et al. | 427/109 |
| 4,689,247 | 8/1987 | Doty et al. | 427/421 |

OTHER PUBLICATIONS

Cooper et al., High Temp. Superconductors, MRS Conf. Proceedings, vol. 99, (Nov. 30–Dec. 4, 1987), pp. 165–170.
Jin et al., Applied Physics Letters, 28 Sep. 1987 (Preprint, 13 Aug. 87).
McKittrick et al., Advanced Ceramic Materials, vol. 2, No. 3B, Special Issue, Jul. 1987, pp. 353–363.
Katsui et al., Japanese Jouranl of Appl. Phys. Lett., vol. 21, No. 3, Mar. 1982, pp. L157–L158.
Katsui et al., Journal of Crystal Growth, vol. 91 (1988), pp. 261–263.
Van Dover et al., Appl. Phys. Lett., vol. 52, No. 22, 30 May 1988, pp. 1910–1912.
Hsu et al., "Dense Bi-Sr-Ca-Cu-O Superconducting Films Prepared by Spray Pyrolysis," Applied Physics Letters, vol. 54, No. 6, Mar. 1989.
Honda et al., "Preparation of High-Tc (105K) Superconducting Phase in Bi-Sr-Ca-K-Cu Oxide System," Japanese Journal of Applied Physics, vol. 27, No. 4, Apr., 1988, pp. L545–L547.
Komatsu et al., "Preparation of High-Tc Superconducting Bi-Ca-Sr-Cu-O Ceramics by the Melt Quenching Method," Japanese Journal of Applied Physics, vol. 27, No. 4, Apr., 1988, pp. L533–L535.
Kawai et al., "Formation of Y-Ba-Cu-O Superconducting Film by a Spray Pyrolysis Method," Japanese Journal of Applied Physics, vol. 26, No. 10, Oct., 1987, pp. L1740–L1742.
Gupta et al., "Y1Ba2Cu3O7 Thin Films Grown by a Simple Spray Deposition Technique," Applied Physics Letters, vol. 52(2), Jan., 1988, pp. 163–165.
Nobumasa et al., "Formation of a 100K Superconducting Bi(Pb)-Sr-Ca-Cu-O Film by Spray Pyrolysis," Japanese Journal of Applied Physics, vol. 27, No. 9, Sep., 1988, pp. L1669–L1671.
Meada et al., "A New High-Tc Oxide Superconductor without A Rare Earth Element," Japanese Journal of Applied Physics, vol. 27, No. 2, Feb., 1988, pp. L209–L210.
Komatsu et al., "Liquid Quenched Superconductor Ba-Y-Cu-O with Tc, zero-88K and AC Josephson Effect at 77K," Japanese Journal of Applied Physics, vol. 26, No. 7, Jul., 1987 pp. L1148–L1149.

Primary Examiner—Shrive Beck
Assistant Examiner—Margaret Bueker
Attorney, Agent, or Firm—Fulbright & Jaworski

[57] ABSTRACT

An improved method for preparing high temperature Bi-Sr-Ca-Cu-O superconductive films utilizing spray pyrolysis. The method can further include an additional annealing step to improve the electrical transport properties.

23 Claims, 2 Drawing Sheets

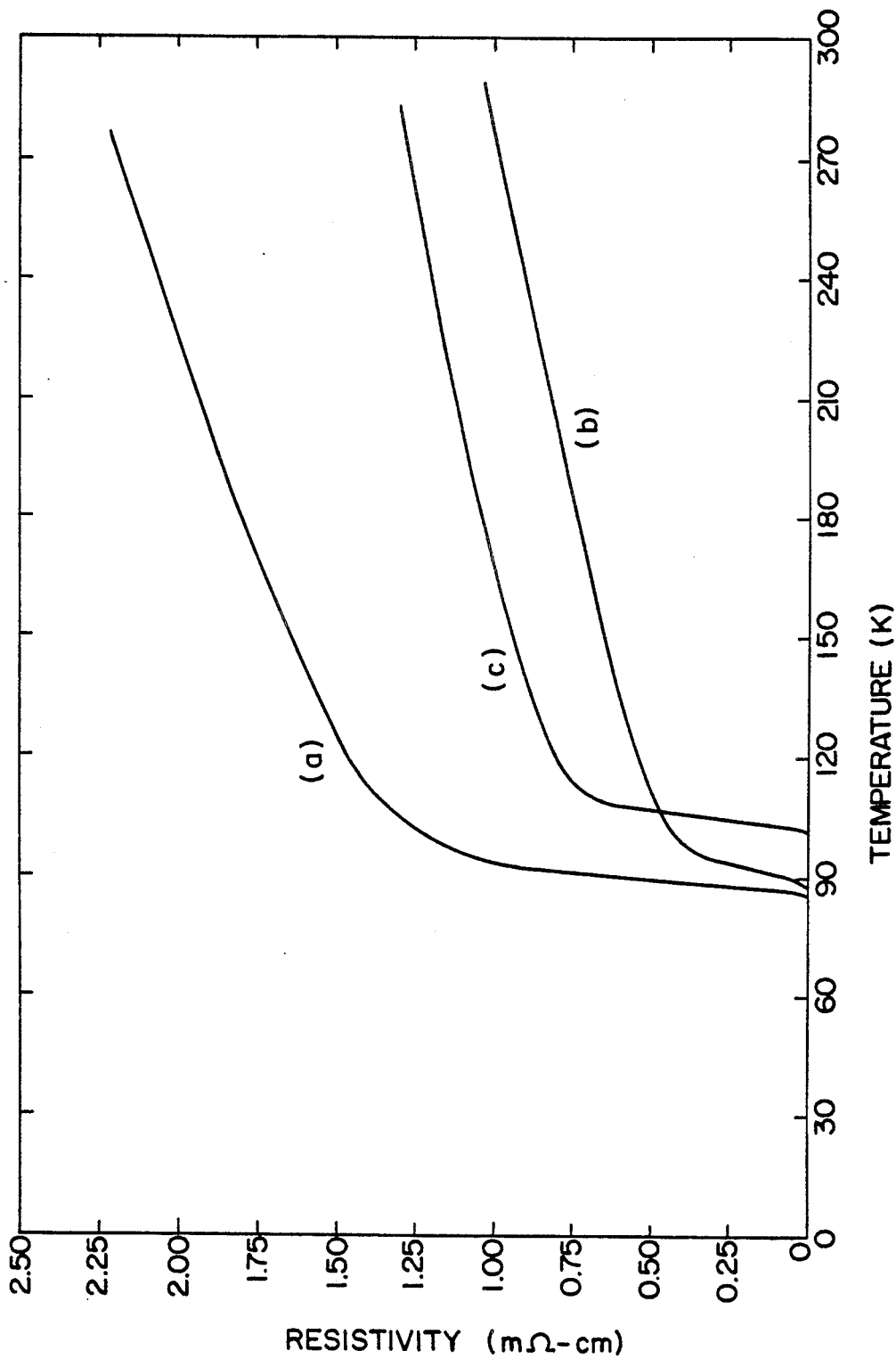

SPRAY PYROLYSIS PROCESS FOR PREPARING SUPERCONDUCTIVE FILMS

BACKGROUND OF THE INVENTION

The present invention relates to an improved method for preparing high temperature superconductive films and, specifically, to an improved spray pyrolysis method for preparing Bi-Sr-Ca-Cu-O superconducting films.

Spray pyrolysis, a low cost method for preparing thin films, is well known For example, U.S. Pat. No. 4,327,119 to Lis, et al. describes a spray pyrolysis method for synthesizing and producing thin films. The films of Lis, et al. find particular utility in photovoltaic devices, and particularly, in solar heat absorbing panels Similarly, U.S. Pat. No. 4,336,285 to Squillante relates to an improvement on the Lis, et al. method which involves the identification and use of certain highly soluble organic acids as reducing agents in the spray pyrolysis solution. Again, the suggested use is for photovoltaic devices.

Spray pyrolysis has been recognized also as a useful method for applying and preparing superconducting thin films. Maki Kawai, et al. describe the formation of Y-Ba-Cu-O superconducting films using a spray pyrolysis method. Of particular relevance, Hitoshi Nobumasa, et al. describe the formation of Bi(Pb)-Sr-Ca-Cu-O superconducting films using a spray pyrolysis application method. The techniques involve relatively low temperature deposition of chemical precursors, such as metal nitrates and acetates, onto suitable substrates, followed by higher temperature processing, both to convert the precursors to oxides and to induce the formation of the superconducting phase. According to the Nobumasa method, an aqueous solution of Bi, Sr, Ca and Cu nitrates was prepared. A lead doping agent was added as a substitute for a portion of bismuth. The solution was sprayed onto a heated MgO substrate. Thereafter, the sprayed substrate was air-cooled and then reheated to 845° C. After a select heating time of two hours or more, the substrate again was allowed to air cool to room temperature.

While the known pyrolysis methods for applying thin superconductive films have yielded useful high quality films, the films often exhibit high porosity and gross textures. These properties are the result of volume shrinkage and the evolution of gaseous byproducts.

In the literature concerning the processing of bulk superconducting oxides, two methods have been reported for enhancing the densification of Bi-Sr-Ca-Cu-O materials. The first is a melt-quench technique. This method is described by T. Komatsu, et al. in (1) *J. Appl. Phys,* 27, L533 (1988) and (2) *J. Appl Phys.* 26, L1148 (1987). The second method is a flux-sinter method in which materials, such as potassium fluoride, are added to the spray solution to enhance mass transport.

SUMMARY OF THE INVENTION

It is, therefore, an object of the present invention to provide an improved spray pyrolysis method for preparing thin superconductive films.

Another object of the invention is to provide an improved spray pyrolysis method which reduces the porosity of the resulting superconductive films and which produces a smoother film texture.

Yet another object of the present invention is to apply bulk superconducting densification techniques to thin superconducting films.

Thus, in accordance with one aspect of the present invention, there is provided an improved spray pyrolysis method for preparing thin superconductive films. The method, referred to herein as the "melt-quench method", comprises the steps of preparing a spray pyrolysis solution of Bi, Sr, Ca and Cu salts in a solvent; heating a substrate to a first temperature, preferably between about 400° and 600° C.; spraying the solution onto the heated substrate to form a film on the substrate; heating the film and substrate at a temperature between about 700°–825° C. for between about 30 and 60 minutes; and thereafter, further heating the film and substrate in an apparatus set at a temperature between about 900° and 1000° C. Once the film and substrate reach a temperature of about 880° C., they are immediately removed from the apparatus and placed in a further heat treatment zone where they are heat treated at a temperature between about 840° and 860° C., preferably about 855° C. for about one hour. The film and substrate are then removed from the heating apparatus and allowed to cool to ambient temperature.

In accordance with another aspect of the present invention, there is provided another method for preparing high temperature, thin, superconductive films using a spray pyrolysis process According to this method, which is referred to herein as the "flux-sinter method", a fluxing agent is added to the solution. The fluxing agent preferably is sodium nitrate or potassium fluoride The solution is sprayed onto a heated MgO or BeO substrate and, thereafter, the film and substrate are heated to a temperature between about 700°–825° C., preferably about 800° C., for 30–60 minutes, as in the melt-quench method. In contrast to the melt-quench method, however, the melt heating step is omitted. This melt heating step is the heat treating step performed at about 880° C. In the flux-sinter method, after the 700°–825° C. heat treatment, the film and substrate are heat treated at about 840°–860° C., preferably about 855° C., as in the final melt-quench heat treatment step.

As a result, two simple film densification processes result which are used in conjunction with low cost pyrolysis techniques to prepare dense oriented superconducting films. Namely, the methods produce Bi-Sr-Ca-Cu-O films having a critical temperature ($T_c$) of 81-83K and critical current densities of at least about 4000 $A/cm^2$ at 78K.

Also, a further heat treating, or annealing, step can be performed on the film after it has cooled to ambient temperature. In accordance with this additional annealing step, the film and substrate are reheated at a temperature of about 600°–700° C. for about 2-15 hours in an inert gas environment. As a result, the $T_c$ of the film is enhanced to about 87K.

These and other objects, features and advantages of the present invention will be more readily apparent from a review of the detailed description of preferred embodiments, when considered with the figures of drawing, a brief description of which follows.

BRIEF DESCRIPTION OF THE DRAWING

FIG. 2 is a graph of resistivity vs. temperature for superconductive film structures of the present invention.

DETAILED DESCRIPTION OF PREFERRED EMBODIMENTS

Figure 1A:
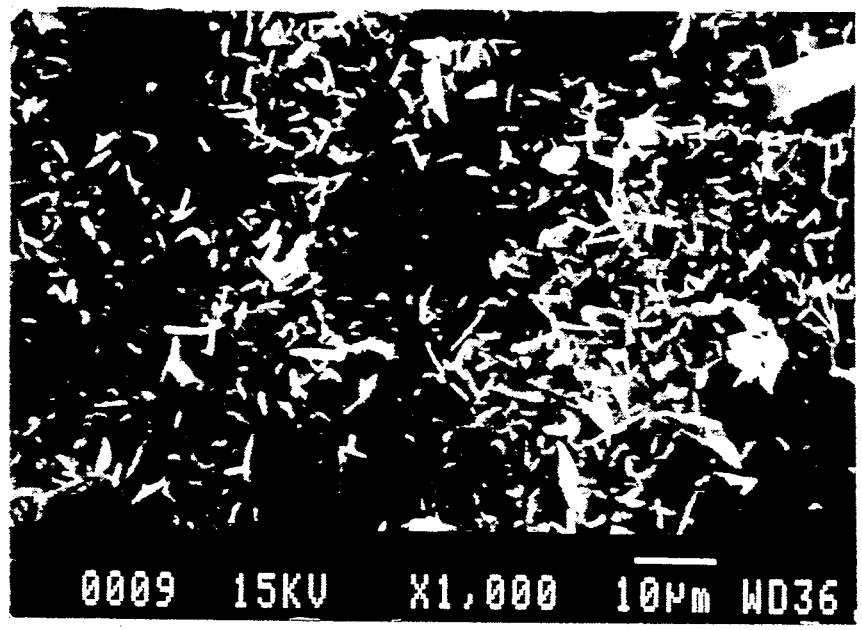
FIG. 1(a) presents a photomicrograph of the superconductive film structure of the present invention made by the melt-quench method.

In performing the method of the present invention, the first step involves the preparation of an aqueous solution. Bismuth, strontium, calcium and copper are dissolved in a solvent. The metals can be in the form of oxides, carbonates, nitrates and the like. A preferred group of starting materials includes bismuth oxide, strontium carbonate, calcium carbonate and cupric oxide. Preferred stoichiometric amounts of Bi:Sr:Ca:Cu are 2:2:1:2 and 4:3:3:4.

The solvent can be selected from a variety of well-known solvents, the important criteria being that the solvent produces a uniform, homogeneous solution when mixed with the solutes. Concentrated nitric acid is preferred when bismuth oxide, strontium carbonate, calcium carbonate and cupric oxide are used.

The aqueous solution should have a cation concentration of at least about 0.1 M. The cation concentration should be limited at the upper end to avoid precipitation of the dissolved materials and to avoid a highly acidic solution which could attack the substrate. Preferably, the molar cation concentration should be in the range from about 0.1 M to 1 M.

Once the desired solution is obtained, it is sprayed onto a substrate. Any of the well-known spray pyrolysis techniques may be used for solution application. The substrate is either a magnesium oxide, preferably a single crystal [100]magnesium oxide, or a hot-pressed beryllium oxide substrate. Beryllium oxide substrates are particularly preferred for high frequency applications due to its favorable dielectric constant, thermal conductivity, and microwave properties.

The substrate is heated to a temperature between about 400° and 600° C. Below 400° C., the final structure may exhibit cracking due to evaporation of trapped water not otherwise removed due to the low substrate temperature. As the temperature of the substrate exceeds 600° C., the risk increases that uniform film distribution will be sacrificed due to aerosol evaporation before it strikes the substrate. Preferably, the substrate temperature is maintained at about 600° C.

After spray distribution, the film undergoes a first heat treatment. The film is heated to a temperature between about 700°–825° C. During this heat treatment step, the water present in the film is removed and the requisite metal oxides are produced. The upper temperature limit reflects the fact that, at temperatures above this limit, the metal nitrates that are present may attack the substrate. Preferably, the temperature is about 800° C.

The length of this first heat treatment step depends on the temperature selected. Generally, the heat treating should continue for about 30 to 60 minutes, with the longer time necessary at the lower temperatures.

After this first heat treatment, the film is moved into a hotter zone, preferably a zone at a temperature between about 900°–1000° C. During this step, the high temperature melts the film. It is desirable to have the melt occur as fast as possible; however, at temperatures much in excess of 1000° C., a loss of control of the substrate temperature occurs due to thermal gradient differences between the thermocouple and the substrate. The temperature of the heat zone is preferably about 950° C.

The film temperature is not allowed to rise to the temperature of the hotter heating zone, however. Instead, the film and substrate are removed immediately upon reaching a temperature in the range of about 870°–890° C., particularly about 880° C. Generally, only about 10 seconds are required to heat the film to 880° C. The time depends on the thermal mass of the devices, such as substrates, substrate holders, and thermocouples, in the hot zone. It will vary from system to system.

The film and substrate are removed from the hot zone to a third heat treatment zone corresponding to the phase transformation temperature of the film. This heat treatment step allows a recrystallization of the Bi-Sr-Ca-Cu-O film. The temperature is between about 840°–860° C., preferably about 850° C. The film should remain in this zone for at least 30 minutes, preferably at least one hour.

Thereafter, the film and substrate are removed from the heat treating zone and allowed to cool to ambient temperature. The process is carried out in an air environment to provide the necessary oxygen for oxidation.

According to another method of the present invention, a densified superconducting film can be achieved by the application of a flux-sinter method. According to this process, a fluxing agent is added to the aqueous solution. The fluxing agent improves the mass transportation properties of the film. The fluxing agent should have a low boiling point to insure that it will be removed from the final film product by the various heat treatment steps. Two preferred agents are sodium nitrate and potassium fluoride.

The amount of the fluxing agent varies according to application. Preferably, the amount of the agent equals about 1/7 to 1/12 on a molar base of the total metal ion concentration of the Bi-Sr-Ca-Cu solution, preferably about 1/10 of the total metal concentration.

The resulting aqueous solution is applied to the substrate in a manner identical to the melt-quench method. Likewise, the resulting film and substrate undergo the same heat treatment as described above with respect to the melt-quench process, with one major exception. Specifically, the film and substrate do not undergo the melt densification step, i.e., the 10 second, 870°–890° C. heat treatment step.

Figure 1B:
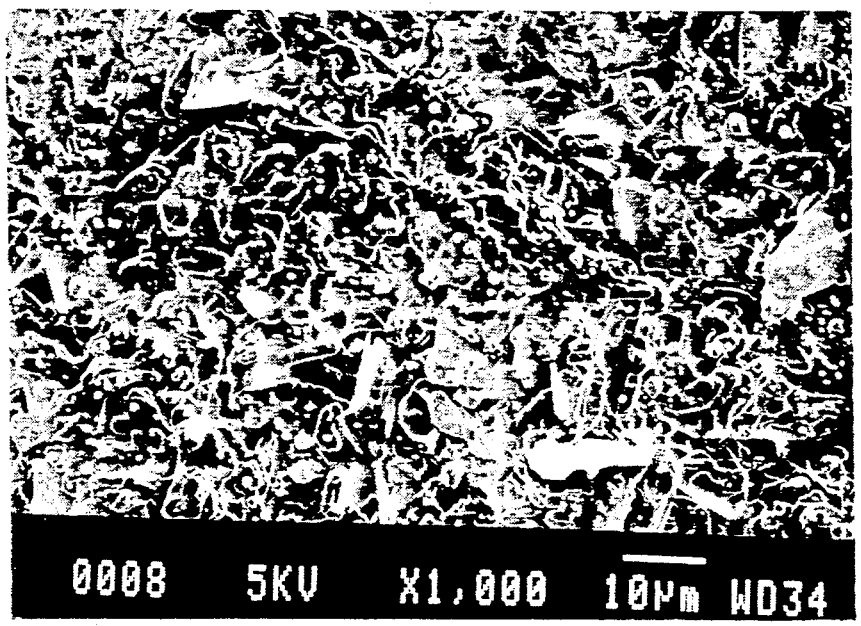
FIG. 1(b) presents a photomicrograph of the superconductive film structure of the present invention made by the flux-sinter method.

The films produced by both methods are similar. Both methods produce dense superconducting films exhibiting a high degree of crystallographic orientation with the c-axis normal to the substrate surface on both single crystal MgO and polycrystalline BeO substrates. FIG. 1(a) and 1(b) show two scanning electron microscope (SEM) photographs of the surface morphology of films made by (a) the melt-quench method, and (b) the flux-sinter method. The resistance versus temperature plots for samples prepared on both MgO and BeO substrates by either of the methods generally were very similar, with zero resistance being attained at 81–83K. FIG. 2 is a representative plot. Critical current densities of at least 4000 A/cm$^2$ at 78K were also attained.

In a further embodiment of both methods, an additional reheating, or annealing, step is performed. According to this step, the film is reheated to about 600°–700° C. for about 2–15 hours in an inert environment. Argon is a preferred inert gas. At temperatures much above 700° C. the superconducting phase becomes unstable. As a result of this additional annealing, an enhancement of $T_c$ occurs, as shown in FIG. 2(b). As shown, the $T_c$ is increased to about 87K.

The present invention will be illustrated further by the following examples. These examples are meant to illustrate and not to limit the invention, the scope of which is defined solely by the appended claims.

EXAMPLE 1

A spray solution was prepared by dissolving bismuth oxide, strontium carbonate, calcium carbonate and cupric oxide in concentrated nitric acid. The metal stoichiometry was 2:2:1:2 (Bi:Sr:Ca:Cu). The solution then was diluted to yield an aqueous solution that was 1.6 M in nitric acid and had a total metal ion concentration of 0.5 M. The solution then was sprayed onto a BeO substrate using a glass concentric nebulizer. A 20 micron film was applied to the substrate. The substrate was held in place on a 600° C. heated block.

Thereafter, the film was placed in a fused quartz combustion tube positioned in a single zone furnace. An air environment was present. The sample temperature was measured by a thermocouple fixed on a sample holder.

The film first was heated to 800° C. for 30 minutes, then moved into a hotter zone set at 950° C. When the sample temperature reached 880° C. (about 10 seconds), the film was removed immediately and placed in a further heat treatment zone set at 855° C. for one hour. The film then was removed and allowed to air cool to ambient temperature.

The resulting film had a critical temperature ($T_c$) of 81K and a critical current density of 4000 A/cm$^2$ at 78K.

EXAMPLE 2

The spray deposition apparatus and spray solution used in Example 2 were identical to that described in Example 1. Several samples of Bi-Sr-Ca-Cu-O films were deposited on a substrate and heat treated, varying the final anneal temperature and gas environment. The annealing time was one hour. The results are summarized in Table 1 below.

TABLE 1

| Sample # | Substrate Temp. at Melting Step (°C.) | Anneal Temp. (°C.) | Environment | $T_c$ (K) | Film Thickness (μm) |
|---|---|---|---|---|---|
| 1 | 880 | 865 | Air | 70 | 3 |
| 2 | 880 | 860 | Air | 80 | 5 |
| 3 | 880 | 855 | Air | 81 | 3 |
| 4 | 880 | 850 | Air | 83 | 4 |
| 5 | 880 | 845 | Air | 82 | 3 |
| 6 | 880 | 840 | Air | 80 | 3 |
| 7 | 880 | 835 | Air | 73 | 5 |
| 8 | 880 | 850 | Oxygen | 76 | 4 |
| 9 | 880 | 850 | Argon | none | — |

EXAMPLE 3

A spray solution was prepared by dissolving bismuth oxide, strontium carbonate, calcium carbonate, cupric oxide and potassium fluoride in concentrated nitric acid. The metal stoichiometry was 2:2:1:2 (Bi:Sr:Ca:Cu) and the concentration of potassium fluoride was 1/10 of the total anion concentration on the molar base. The solution then was diluted to yield an aqueous solution that was 1.6 M in the nitric acid and had a total anion concentration of 0.5 M. The solution then was sprayed onto a MgO substrate using a glass concentric nebulizer. A film of 25 microns was applied to the substrate. The substrate was held in place on a 600° C. heated block.

Thereafter, the film was placed in a fused quartz combustion tube positioned in a single zone furnace. An air environment was present. The sample temperature was measured by a thermocouple fixed on the sample holder.

The film first was heated to 800° C. for 30 minutes, then moved into a hotter zone set at 850° C. and allowed to anneal at this temperature for one hour. The film then was removed and allowed to air cool to ambient temperature.

The resulting film had a critical temperature ($T_c$) of 83K.

EXAMPLE 4

The spray deposition apparatus in Example 4 was identical to that described in Example 3. Several samples of Bi-Sr-Ca-Cu films were deposited on a substrate and heat treated, varying fluxing agent (potassium fluoride or sodium nitrate) concentration, anneal temperature, and anneal time. The annealing environment was air. The results were summarized in Table 2.

TABLE 2

| Sample # | Fluxing Agent Concentration (per total anion concentration) | Anneal Temp. (°C.) | Anneal Time | $T_c$ (K) |
|---|---|---|---|---|
| 1 | 1/6 | 850 | 1 hour | 60 |
| 2 | 1/7 | 850 | 1 hour | 78 |
| 3 | 1/8 | 850 | 1 hour | 80 |
| 4 | 1/10 | 850 | 1 hour | 83 |
| 5 | 1/12 | 850 | 1 hour | 80 |
| 6 | 1/15 | 850 | 1 hour | 40 |
| 7 | 1/10 | 860 | 1 hour | 79 |
| 8 | 1/10 | 840 | 1 hour | 46 |
| 9 | 1/10 | 850 | 17 hour | 82 |
| 10 | 1/10 | 850 | .5 hour | 78 |

EXAMPLE 5

The Bi-Sr-Ca-Cu-O film of Example 1 was further treated by reheating the sample in argon to 700° C. for 2 hours. The resulting film evidenced a $T_c$ of 87K.

EXAMPLE 6

The Bi-Sr-Ca-Cu-O film of Example 3 was further treated by reheating the sample in argon to 700° C. for 2 hours. The resulting film evidenced a $T_c$ of 87K.

EXAMPLE 7

Several samples of Bi-Sr-Ca-Cu-O films with high $T_c$ were further heat treated in argon, varying the anneal time and temperature. The samples were produced by both the melt-quench and the flux-sinter methods. The results are summarized in Table 3.

TABLE 3

| Sample # | Original $T_c$ (K) | Anneal Temperature (°C.) | Anneal Time | Final $T_c$ |
|---|---|---|---|---|
| 1 | 81 | 800 | 2 hour | none |
| 2 | 81 | 700 | 2 hour | 87K |
| 3 | 81 | 600 | 2 hour | 86K |
| 4 | 81 | 500 | 2 hour | 81K |
| 5 | 81 | 700 | 15 hour | 87K |
| 6 | 82 | 700 | .5 hour | 84K |

The present invention, therefore, is well adapted to carry out the objects and attain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. A spray pyrolysis method for preparing thin superconductive film, comprising the steps of:
   (a) preparing a spray pyrolysis solution comprising Bi, Sr, Ca and Cu metals in a solvent;
   (b) heating a substrate to a first temperature;
   (c) spraying said solution onto said heated substrate to form a film thereon;
   (d) heating said film and substrate to a second temperature of about 700°–825° C., said second temperature being higher than said first temperature;
   (e) heating said film and substrate to a third temperature of about 870°–890° C. to melt said film;
   (f) once said film and substrate reach said third temperature, further heat treating said film and substrate at a fourth temperature of about 840°–860° C.; and
   (g) cooling said film and substrate to ambient temperature.

2. A method as claimed in claim 1, wherein said first temperature is about 400°–600° C.

3. A method as claimed in claim 2, wherein said first temperature is about 600° C.

4. A method as claimed in claim 1, wherein said second temperature is about 800° C.

5. A method as claimed in claim 1, wherein said third temperature is about 880° C.

6. A method as claimed in claim 1, wherein said heating step (e) includes heating in an apparatus set at a temperature between about 900°–1000° C.

7. A method as claimed in claim 6, wherein said apparatus temperature is about 950° C.

8. A method as claimed in claim 1, wherein said fourth temperature is about 855° C.

9. A method as claimed in claim 1, wherein said Bi:Sr:Ca:Cu stoichiometry is about 2:2:1:2.

10. A method as claimed in claim 1, wherein said Bi:Sr:Ca:Cu stoichiometry is about 4:3:3:4.

11. A method as claimed in claim 1, wherein said solvent is nitric acid.

12. A method as claimed in claim 1, wherein the thickness of said film is about 2 to 6 microns.

13. A spray pyrolysis method for preparing thin superconductive films, comprising the steps of:
   (a) preparing a spray pyrolysis solution comprising Bi, Sr, Ca and Cu metals and a fluxing agent in a solvent;
   (b) heating a substrate to a first temperature;
   (c) spraying said solution onto said heated substrate to form a film thereon;
   (d) heating said film and substrate to a second temperature of about 700°–825° C., said second temperature being higher than said first temperature;
   (e) heating said film and substrate at a third temperature of about 840°–860° C.; and
   (f) cooling said film and substrate to ambient temperature.

14. A method as claimed in claim 13, wherein said fluxing agent is selected from the group consisting of sodium nitrate and potassium fluoride.

15. A method as claimed in claim 13, wherein said fluxing agent is added in an amount equal to about one-tenth of the total metal ion concentration of said Bi, Sr, Ca and Cu.

16. A method as claimed in claim 13, wherein said first temperature is about 400°–600° C.

17. A method as claimed in claim 13, wherein said second temperature is about 800° C.

18. A method as claimed in claim 13, wherein said third temperature is about 850° C.

19. A method as claimed in claim 1, comprising the further step of (h) annealing said film and substrate in an inert gas of about 600°–700° C.

20. A method as claimed in claim 19, wherein said annealing temperature is about 700° C.

21. A method as claimed in claim 13, comprising the further step of (g) annealing said film and substrate in an inert gas at about 600°–700° C.

22. A method as claimed in claim 21, wherein said annealing temperature is about 700° C.

23. A spray pyrolysis method for preparing thin superconductive films, comprising the steps of:
   spraying a spray pyrolysis solution comprising Bi, Sr, Ca and Cu metals in a solvent onto a heated substrate to form a film thereon; and
   heating said film and substrate to melt said film.

* * * * *